US011569631B2

(12) United States Patent
Kante et al.

(10) Patent No.: US 11,569,631 B2
(45) Date of Patent: Jan. 31, 2023

(54) NON-RECIPROCAL LASING IN TOPOLOGICAL CAVITIES OF ARBITRARY GEOMETRIES

(71) Applicant: THE REGENTS OF THE UNIVERSITY OF CALIFORNIA, Oakland, CA (US)

(72) Inventors: Boubacar Kante, La Jolla, CA (US); Babak Bahari, La Jolla, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 398 days.

(21) Appl. No.: 16/636,155

(22) PCT Filed: Jul. 24, 2018

(86) PCT No.: PCT/US2018/043427
§ 371 (c)(1),
(2) Date: Feb. 3, 2020

(87) PCT Pub. No.: WO2019/027729
PCT Pub. Date: Feb. 7, 2019

(65) Prior Publication Data
US 2020/0176943 A1 Jun. 4, 2020

Related U.S. Application Data

(60) Provisional application No. 62/540,809, filed on Aug. 3, 2017.

(51) Int. Cl.
*H01S 3/063* (2006.01)
*B82Y 20/00* (2011.01)
(Continued)

(52) U.S. Cl.
CPC .............. *H01S 3/063* (2013.01); *G02F 1/365* (2013.01); *H01S 3/094* (2013.01)

(58) Field of Classification Search
CPC . H01S 3/063; H01S 3/094; H01S 5/11; H01S 2301/166; H01S 5/1071;
(Continued)

(56) References Cited

U.S. PATENT DOCUMENTS 4,793,872 A * 12/1988 Meunier ........... H01L 21/02546
148/DIG. 72
8,102,588 B2 * 1/2012 Alameh ................ H01F 10/265
359/280
(Continued)

OTHER PUBLICATIONS

He et al., "Photonic topological insulator with broken time-reversal symmetry.", Proceedings of the National Academy of Sciences, 113(18), 4924-4928, 2016 (Year: 2016).*
(Continued)

*Primary Examiner* — Xinning(Tom) Niu
(74) *Attorney, Agent, or Firm* — Stuart H. Mayer; Mayer & Williams PC

(57) ABSTRACT

A laser source includes a topological cavity for nonreciprocal lasing, a magnetic material and an optical waveguide. The magnetic material is arranged to interact with the topological cavity. The optical waveguide is arranged to receive light extracted from the topological cavity upon breaking of time-reversal symmetry in the topological cavity.

13 Claims, 9 Drawing Sheets

(51) Int. Cl.
*G02F 1/365* (2006.01)
*H01S 3/094* (2006.01)

(58) Field of Classification Search
CPC ...... H01S 5/4025; H01S 5/405; H01S 5/1021; H01S 5/041; H01S 3/09; H01S 3/0637; H01S 3/2383; G02F 1/365; B82Y 20/00
See application file for complete search history.

(56) References Cited

U.S. PATENT DOCUMENTS

| | | | |
|---|---|---|---|
| 9,024,415 B2 | 5/2015 | Zhang | |
| 10,725,131 B2 * | 7/2020 | Clerk | ........................ H03F 3/20 |
| 2015/0295379 A1 | 10/2015 | Ozdemir et al. | |

OTHER PUBLICATIONS

Bahar et al., "Nonreciprocal lasing in topological cavities of arbitrary geometries." Science. 12 Oct. 1-13, 2017 (Oct. 12, 2017).
He et al., "Photonic topological insulator with broken time-reversal symmetry." PNAS. vol. 113, 1-13 No. 18, May 3, 2016 (May 3, 2016).

* cited by examiner

NON-RECIPROCAL LASING IN TOPOLOGICAL CAVITIES OF ARBITRARY GEOMETRIES

BACKGROUND

In 1929, soon after the advent of quantum mechanics, Bloch, following Hill, Floquet, and Lyapunov, established the theory of the electronic band structure of solids (electrons are fermions), resulting in the classification of materials as either electrical conductors or insulators. Several decades afterwards, it was understood that the well-known band structure of fermionic systems actually obeys a more sophisticated classification beyond the Landau spontaneous symmetry breaking theory. Fermionic materials known as topological insulators were then discovered. These materials are insulators in their bulk but conductors at their interfaces.

In 2008, Raghu and Haldane demonstrated that topological classifications can surprisingly be extended to bosonic systems, namely photonic crystals which also possess a band structure obeying Bloch's theorem. Intriguing experimental demonstration of robust electromagnetic transport in microwaves immediately followed and topological order has since been shown to be ubiquitous in many areas of wave physics including microwaves, acoustics, excitonics, and plasmonics. However, experimental demonstrations in systems with broken time-reversal symmetry, have until now been limited to the passive topological transport of electromagnetic waves at low frequencies.

Proposals to increase the operating frequency from microwaves to terahertz all the way to the optical regime have been put forward for various devices with and without time-reversal symmetry breaking. Topological lasing has been proposed in two dimensions using arrays of ring resonators with no time-reversal symmetry breaking, and in one-dimensional lattice of polariton micropillars that implements an orbital version of the Su-Schrieer-Heeger Hamiltonian. However, these systems cannot implement cavities of arbitrary shapes due to their preserved time-reversal symmetry. An elusive, but fundamental, implication of topology is the existence of a new class of geometry-independent photonic components. For example, the possibility to construct geometry-independent cavities opens a new paradigm in cavity quantum electro dynamics and photonic integration, as, it enables denser packing of components and sources of arbitrary form-factors. This prospect will alleviate the, otherwise stringent, constraints to use preset cavities that leave much chip space unused. Topology also naturally addresses the pressing need for non-reciprocal components that protect sources against back scattering.

SUMMARY

In one aspect, the subject matter disclosed herein is directed to methods, devices and systems that pertain to integrated photonic topological cavities for non-reciprocal lasing and cavities of arbitrary shapes. The invention addresses long standing issues in photonic integration as it allows sources to have arbitrary form-factors. In some embodiments the disclosed subject matter may enable one or more of the following: an integrated unidirectional laser that emits the coherent light in one direction, while naturally protects itself from any kind of damage caused by back-reflected power; a laser controllable using EMF, that is by controlling the strength of the EMF, the size of the photonic band gap and thus the amount of the output power of the laser can be controlled. These new capabilities have utility for a broad range of laser applications.

In the methods, devices and systems described herein, one-way light originates from a new physical concept called "Topological Insulator". In Topological Insulators, by putting two distinct periodic structures with different topological invariants, it is possible to excite one-way edge mode along their interface. Also, it is important to break the time-reversal symmetry, which is done using an optical magnetic material such as Yttrium Iron Garnet (YIG). Gain material, e.g., InGaAsP, is bonded onto the YIG substrate. Application of an External Magnetic Field (EMF) saturates the YIG, thus breaking the time-reversal symmetry.

One exemplary embodiment demonstrates, at telecommunication wavelengths, geometry-independent and integrated non-reciprocal topological cavities that couple stimulated emission from one-way photonic edge states to a selected waveguide output with an isolation ratio in excess of 10 dB.

Among the various advantages offered by various embodiments of the methods, devices and systems described herein compared to other works are one or more of the following:

1) A demonstration of a unidirectional integrated laser based on a Topological Insulator.
2) A unidirectional integrated laser that is based on a Topological Insulator, which is naturally self-protected from any back-reflected powers into the system. In commercial lasers, in order to protect lasers from damages caused by back-reflected powers, an external (or secondary) component called isolator is used. However, in the device disclosed herein, self-protection is an inherent characteristic originated from the novel physics of the device called a Topological Insulator.
3) In some embodiments an optical magnetic material of YIG is used in which an External Magnetic Field (EMF) is applied to break time-reversal symmetry. Depending on the strength of the EMF, the output power of the laser can be controlled and the direction of the emission can be completely changed.
4) Controllability using EMF provides the ability to use the device as an optical switch by turning on/off the EMF.

BRIEF DESCRIPTION OF THE DRAWINGS

FIG. 4B show a real space image of the arbitrarily-shaped topological cavity device when the EMF is turned on;

DETAILED DESCRIPTION

Described herein are methods, devices and systems for producing non-reciprocal single mode lasing from topological cavities of arbitrary geometries that may be operational, for instance, at room temperature and telecommunication wavelengths. The integrated non-reciprocal topological cavities, using a static magnetic field to break time-reversal symmetry, couple stimulated emission from one-way photonic edge states to a selected waveguide output with an isolation ratio in excess of 10 dB. The device opens perspectives in integrated photonics, in which, information can robustly flow between sectors characterized by different topological indices.

Figure 1:
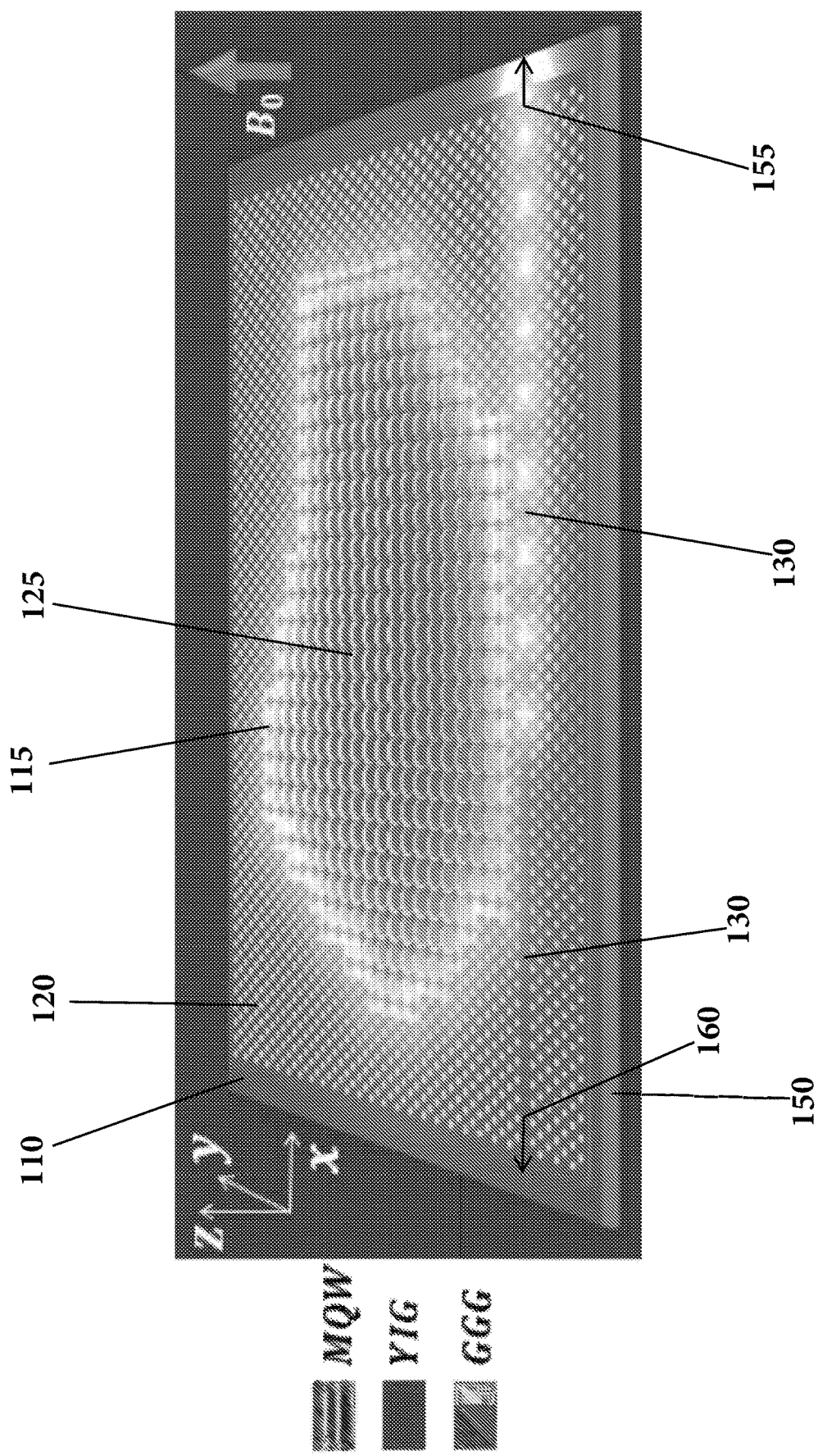
FIG. 1 shows a schematic diagram of one example of a topological cavity device for generating nonreciprocal laser light.

FIG. 1 shows a schematic diagram of one example of the topological cavity device 100. The device 100 includes a topological cavity 110, which is an arbitrarily-shaped closed contour 115 formed at the boundary between two photonic structures 120 and 125 with distinct topological invariants. A waveguide 130 is evanescently coupled to the topological cavity 110.

The photonic structures 120 and 125 may be formed from any semiconductor light emitting material that may be pumped optically or electrically. In one particular embodiment, shown in FIG. 1, the photonic structures 120 and 125 may be formed from multiple quantum well (MQW) structures. In one particular embodiment the multiple quantum well structures 120 and 125 each includes two or more InGaAsP quantum well layers separated by one or more quantum well barrier layers (e.g., GaAsP, InGaAsP). The mole fraction of the components in each layer may be tailored so that the structure emits light at the desired wavelength(s). For instance, the quantum well layer may have the form In$_x$Ga$_{1-x}$As$_y$P$_{1-y}$ and, in one particular realization, may include nine In$_{x=0.564}$Ga$_{1-x}$As$_{y=0.933}$P$_{1-y}$ quantum well layers of 10 nm thickness (bandgap wavelength of 1600 nm) and In$_{x=0.737}$Ga$_{1-x}$As$_{y=0.569}$P$_{1-y}$ barrier layers of 20 nm thickness (bandgap wavelength of 1300 nm). Of course, the photonic structures 120 and 125 may be formed from other multiple quantum well structure including, for instance, InAlGaAs/InGaAs and AlGaSb/GaSb material systems. These material systems may result in topological cavity devices that operate at any suitable wavelengths(s), including wavelengths in the ultraviolet and visible spectral bands.

The topological cavity 110 is bonded on a magnetic material such as garnet-based materials. In one particular embodiment, shown in FIG. 1, the magnetic material is Yttrium Iron Garnet (YIG) layer 140, which is a gyrotropic material grown on a Gadolinium Gallium Garnett (GGG) substrate 150 by a deposition technique such as molecular beam epitaxy. The magnetic material (e.g., YIG layer 140) is used to break time-reversal symmetry in the system under a static External Magnetic Field (EMF).

As discussed above, the topological cavity 110 is formed from a closed contour 115 that is defined by two different photonic structures such as Photonic Crystals (PhCs). In one embodiment, shown in FIG. 1, the photonic structure 125 inside contour 115 is a PhC having a square lattice with a star-shaped unit cell. The photonic structure 120 outside the contour 115 is a PhC that constitutes the rest of the topological cavity 110 and is made of a triangular lattice with cylindrical air holes unit cell. In this embodiment the waveguide 130 coupled to the topological cavity 110 may be a defect waveguide created by removing a line of air holes in the PhC 120 with the triangular lattice. The distinct topological invariants of the two photonic structures 120 and 125 will ensure the existence of robust one-way edge states at their interface, creating a one-way topological cavity that will evanescently couple its emission either to the right output 155 or the left output 160 of the waveguide 130 depending on the direction of the EMF. For example, as illustrated in FIG. 1, a counterclockwise topological edge state in will preferentially couple its emission to the right output 155 of the waveguide 130.

Figure 2A:
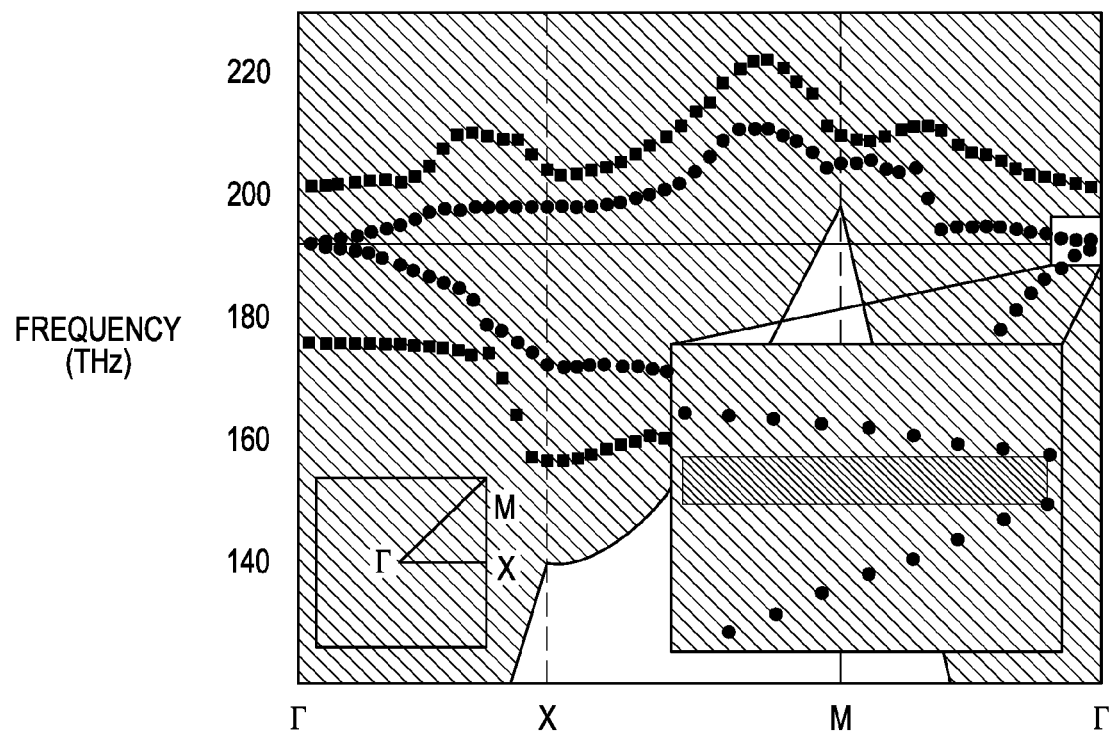
FIG. 2A shows the band diagram of a square lattice photonic crystal (PhC) in the presence of an external magnetic field (EMF)
Figure 2A:
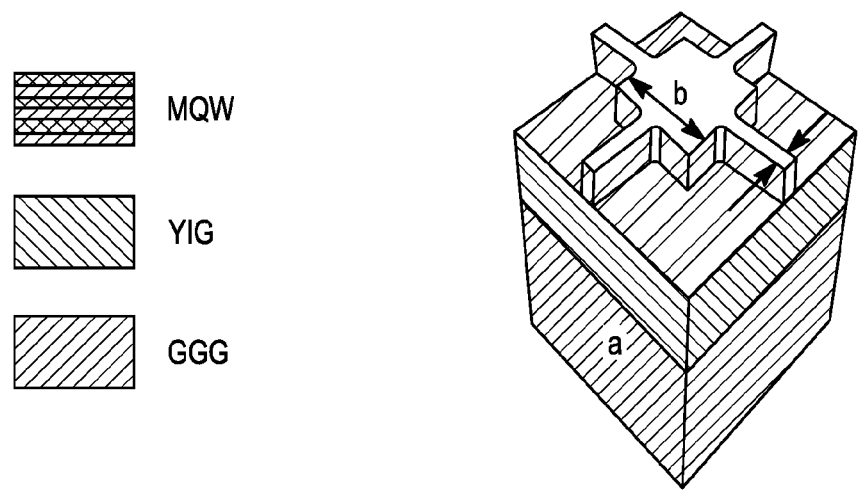

Band diagrams of the two PhCs 120 and 125 are calculated using finite-element method. In this example the thickness of the of the InGaAsP MQW and the YIG are 300 nm and 200 nm, respectively. FIG. 2A shows the band diagram of the square lattice PhC 125 in the presence of an EMF B=$B_0 e_z$, with $B_0$=+100 Oe. The unit cell is shown at the bottom of FIG. 2A. In this example the PhC 120 is made of InGaAsP material and it has a square lattice with dimensions a=1084 nm (period), b=0.46a, and w=0.0844a. The band diagram of the square lattice PhC 125 is calculated in presence of an EMF that saturates the YIG material, and thus maximizes the non-diagonal component of its dielectric permittivity tensor. Initially, the EMF is zero, and, the band structure does not exhibit any gap in the frequency range of interest. Application of the EMF (+$B_0$) opens a narrow band gap with a width of $\Delta\lambda$~42 pm. The topological invariant associated with the corresponding band gap, also known as Chern number, is |$\Delta C$|=1. This band gap is called a non-trivial band gap because of its non-zero Chern number.

Figure 2B:
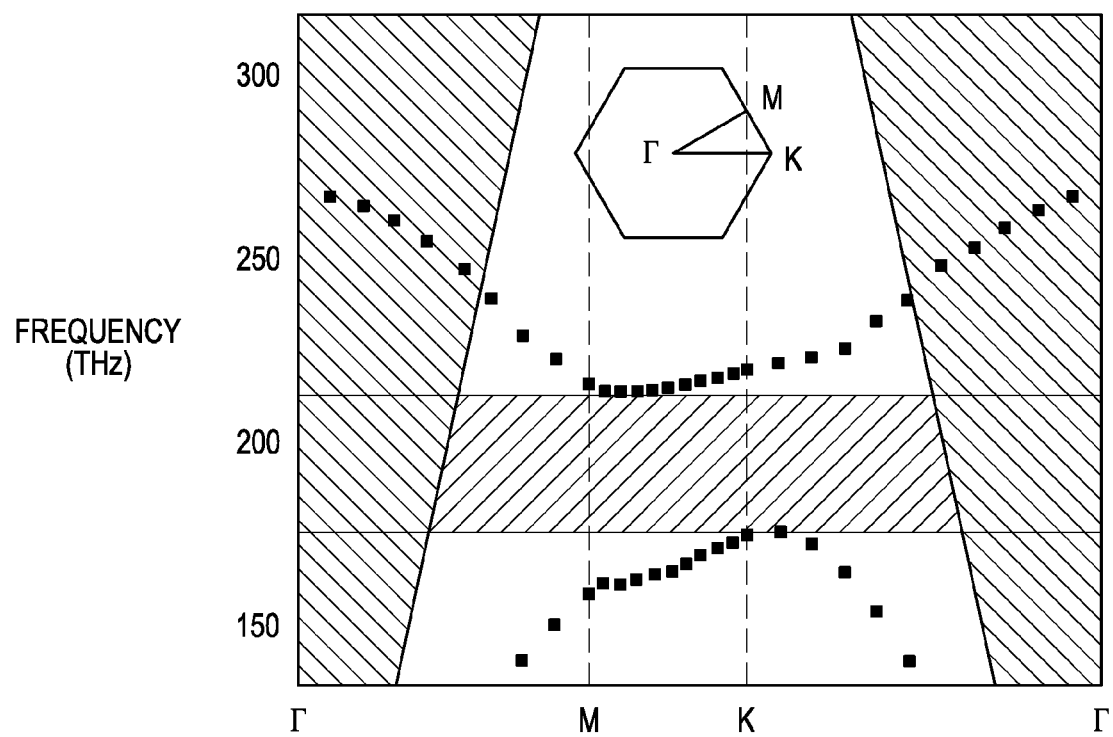
FIG. 2B shows the band diagram of a triangular lattice photonic crystal (PhC) in the presence of an external magnetic field (EMF)
Figure 2B:
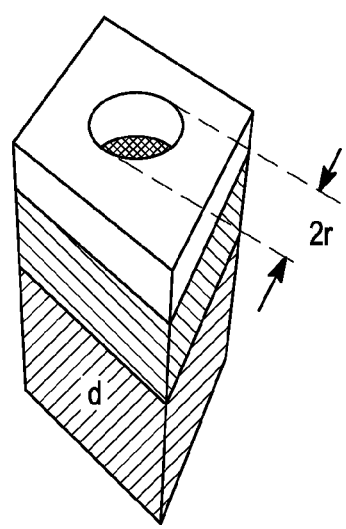

One-way interfaces can be implemented using another PhC with a different topological invariant. As seen in FIG. 2B, the PhC 120 with a triangular lattice possesses a broad band gap regardless of the amplitude of the EMF and in particular for the value of EMF used for the non-trivial PhC 125. The cylindrical air hole unit cell of the PhC 120 is shown at the bottom of FIG. 2B. The periodicity d and radius of holes r are a/3 and 0.35d, respectively. Calculations indicate a zero Chern number for this gap that is thus called a trivial band gap. In this example the dimensions of the two PhCs 120 and 125 have been chosen to overlap their band gaps around the telecommunication wavelength of $\lambda$~1.5 $\mu$m, where the gain of InGaAsP material peaks. The closed contour between the trivial and non-trivial photonic structures 120 and 125 constitutes the topological cavity 110 that, in principle, can have arbitrary geometries while maintaining its resonant frequency.

Figures 2C, 2D:
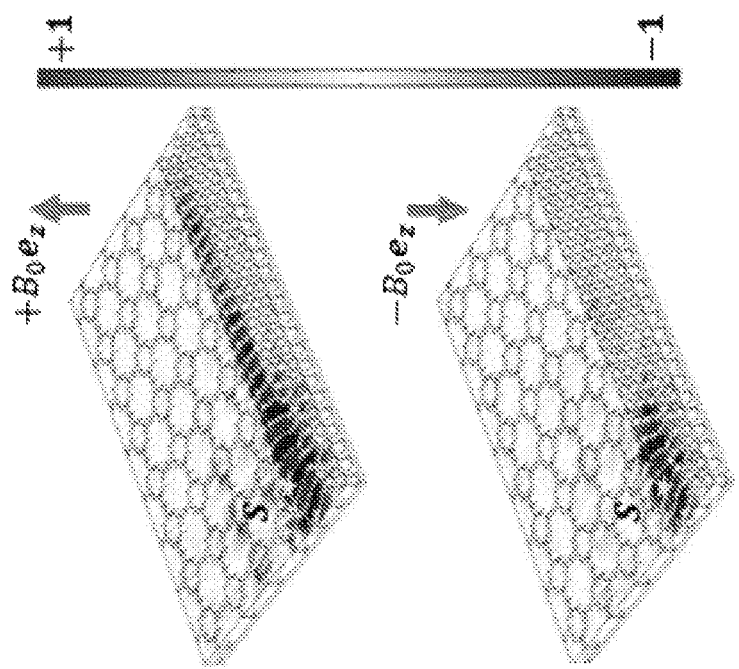
FIG. 2C shows a topological cavity device in which the energy of the device is confined at the interface and propagates to the right when an EMF of $+B_0 e_z$ is applied.
FIG. 2D shows a topological cavity device in which the energy of the device is confined at the interface and propagates to the left when an EMF of $-B_0 e_z$ is applied.

The dissimilar topology of the two band gaps is numerically verified in FIG. 2C and 2D. A point source, with a wavelength in the band gap of the two crystals, is placed at the interface between the two PhCs. FIG. 2C shows that the energy of the source is confined at the interface and propagates to the right for an EMF of +$B_0 e_z$. By reversing the direction of the EMF ($-B_0 e_z$) as shown in FIG. 2D, the propagation to the right is forbidden, demonstrating the existence of a one-way edge state. The boundary between these two PhCs with overlapping band gaps thus supports one-way edge states that propagate either to the right (FIG. 2C) or to the left (FIG. 2D) depending on the direction of the EMF.

Figures 3A, 3B, 3C:
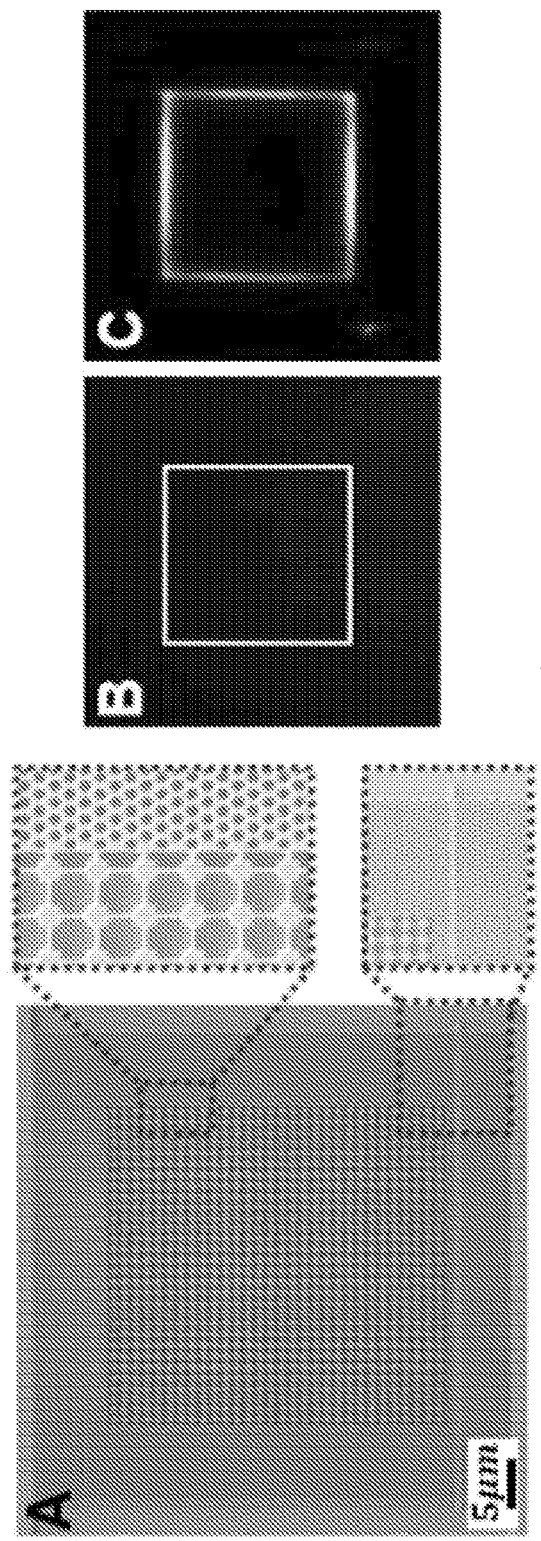
FIG. 3A shows a top view Scanning Electron Micrograph (SEM) of a square-shaped topological cavity device.
FIG. 3B shows a real space camera image of the top of the topological cavity device without application of an EMF under optical pumping.
FIG. 3C shows a real space camera image of the top of the topological cavity device with application of an EMF under optical pumping.

To demonstrate the versatility of the proposed device, a square cavity coupled to the waveguide was first investigated. The total length of the non-trivial cavity and the coupling length between the cavity and the waveguide were optimized for the edge mode. The structure was fabricated by electron beam lithography followed by dry etching to form the trivial and non-trivial PhCs. The PhCs were subsequently bonded on a flat YIG substrate coated with a thin layer of polymethyl methacrylate (PMMA). Finally, the InP substrate, on which the InGaAsP was epitaxially grown, was removed by wet etching using hydrochloric acid. FIG. 3A presents a top view Scanning Electron Micrograph (SEM) of a fabricated device where the trivial and non-trivial PhCs together with the waveguide can be seen. The fabrication is uniform over the entire area of the device.

To experimentally characterize the devices, they were optically pumped from the top with a pulsed laser ($\lambda$=1064 nm, T=12 ns pulse at a repetition rate f=275 kHz) using a micro photoluminescence setup. The size of the pump beam was controlled to cover the whole area of the device. FIGS. 3B and 3C show real space camera images of the surface of the devices without ($B_0$=0) and with ($B_0$=+100 Oe) EMF respectively, for a pump power density of $\rho$=0.9 $\mu W/\mu m^2$. Unambiguously, an edge mode, localized at the interface between the two PhCs is observed in the presence of the EMF (FIG. 3C) while it disappears when the EMF is turned off (FIG. 3B).

To further characterize the device and demonstrate the unidirectionality of the edge mode, a lensed fiber was coupled to one of the outputs of the waveguide. The outputs of the waveguides are tapered to ensure efficient coupling to the fiber. The coupling was aided by a piezoelectric positioning device with nanometer resolution. The tip of the lensed fiber was placed in front of the waveguide and the other end of the fiber was directly connected to an optical spectrum analyzer.

Figure 3D:
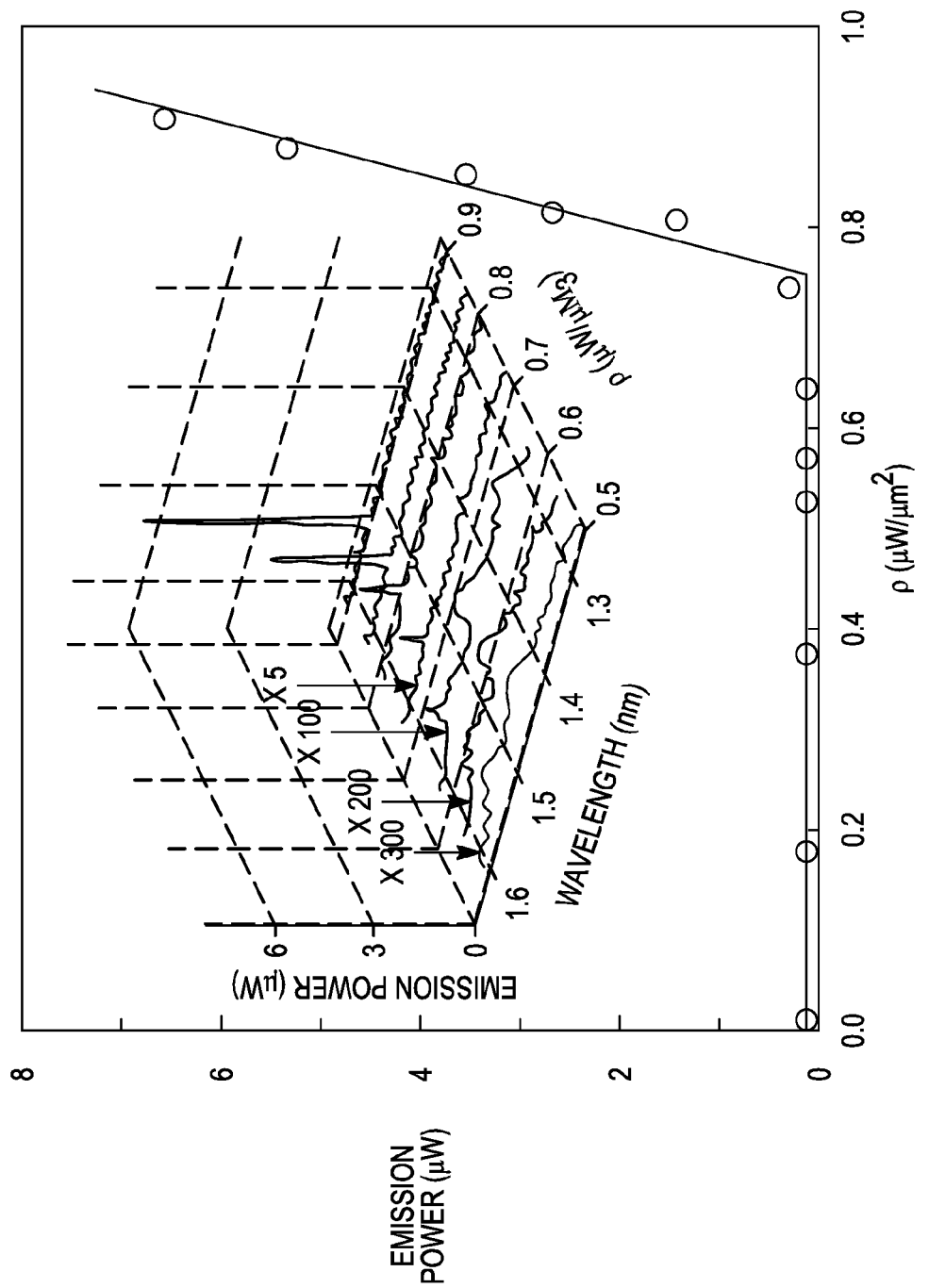
FIG. 3D shows the evolution of the output power as a function of both pump power density and wavelength.

FIG. 3D shows the evolution of the output power as a function of both pump power density and wavelength. By varying the pump power density with the EMF turned on, a threshold behavior with a clear transition from spontaneous emission to stimulated emission (lasing) was observed. Turning off the EMF results in the suppression of lasing.

Figure 3E:
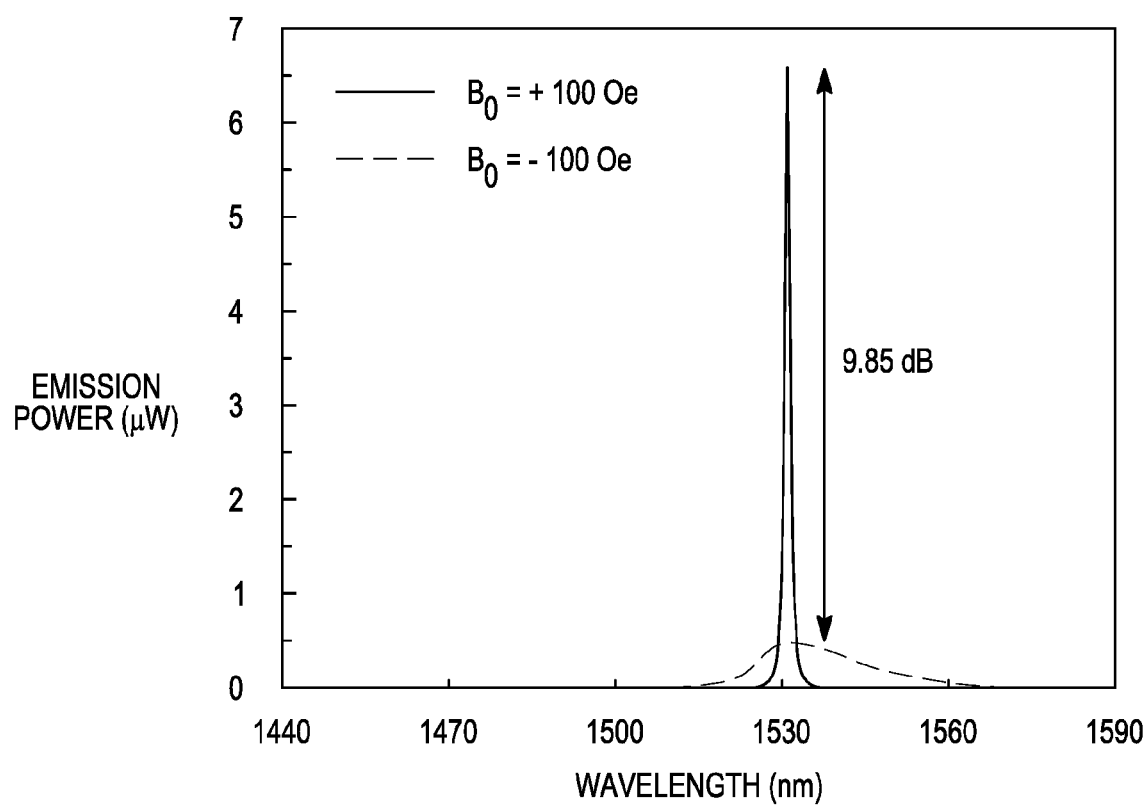
FIG. 3E shows the output emission power of the topological cavity device for two opposite value of the EMF (+$B_0$ and −$B_0$) for the same pump power density ($\rho$=0.9 $\mu$W/$\mu$m$^2$) in the lasing regime.

To prove that lasing is from a one-way edge mode, we flipped the direction of the EMF by reversing the current in the solenoid creating $B=-B_0 e_z$ and measured the emitted power and its spectrum. This is equivalent to coupling the fiber to the other end of the waveguide for a fixed direction of the EMF, with the advantage of avoiding discrepancies between the coupling efficiencies to the two ends of the waveguide, thus enabling quantitative comparison of the emissions. The dots in FIG. 3D are experimental measurements of the output power for different pump power densities when the EMF is turned on. The solid lines are linear fits to the data in spontaneous and stimulated emission regimes and clearly show a threshold behavior, i.e., lasing. No lasing is observed in the absence of EMF FIG. 3E shows the output emission power of the structure for two opposite value of the EMF ($+B_0$ and $-B_0$) for the same pump power density ($\rho$=0.9 $\mu W/\mu m^2$) in the lasing regime, which is equivalent to collecting emission from the two outputs of the waveguide with the advantage of avoiding coupling discrepancies. As seen, there is a large reduction in the luminescence spectrum and an isolation ratio of 9.85 dB is measured. In non-topological cavities with broken time-reversal symmetry (that cannot have arbitrary shapes), the Clock-Wise (CW) and the Counter Clock-Wise (CCW) modes of the cavity have similar characteristics, but a small wavelength shift. However, in topological cavities, one of the modes, either the CW or the CCW is forbidden depending on the direction of the EMF, and thus, cannot be excited, ensuring single mode operation. This is a fundamental difference between these systems, as non-topological cavities will exhibit two slightly detuned modes that both lay within the broad gain bandwidth of the semiconductor and would thus give rise to mode competition.

Figure 4A:
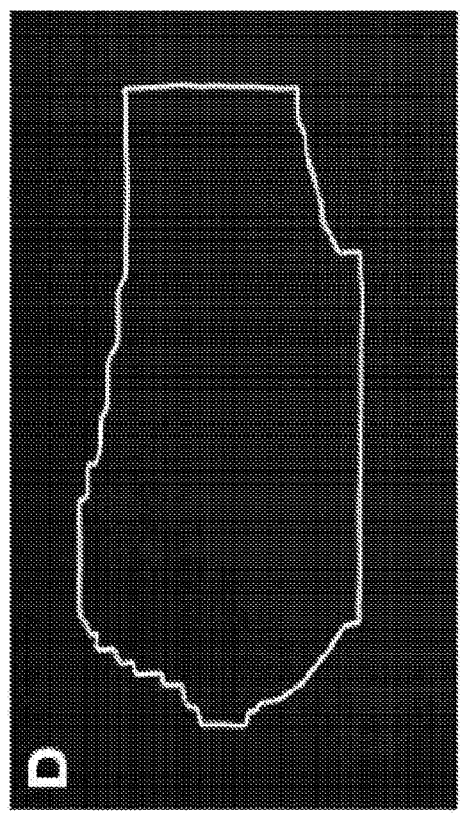
FIG. 4A shows a top view SEM of an arbitrarily-shaped topological cavity.
Figure 4B:
Figure 4D:
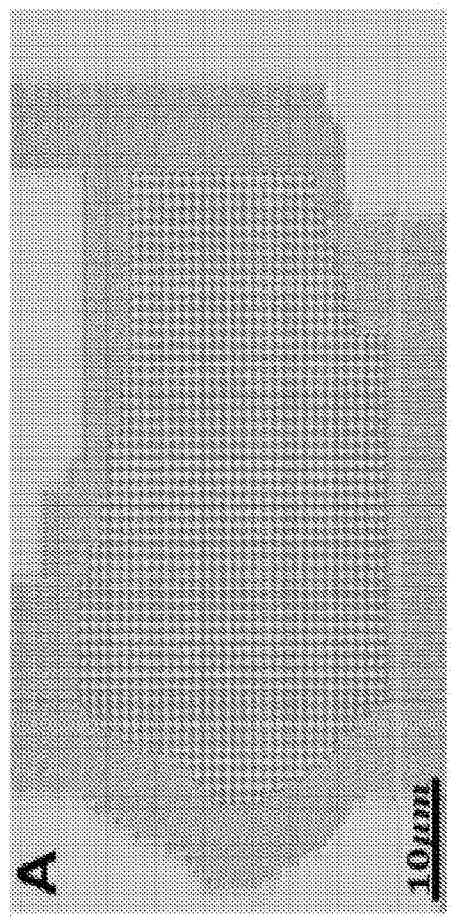
FIG. 4D shows a real space image of the arbitrarily-shaped topological cavity device when the EMF is turned off.
Figure 4C:
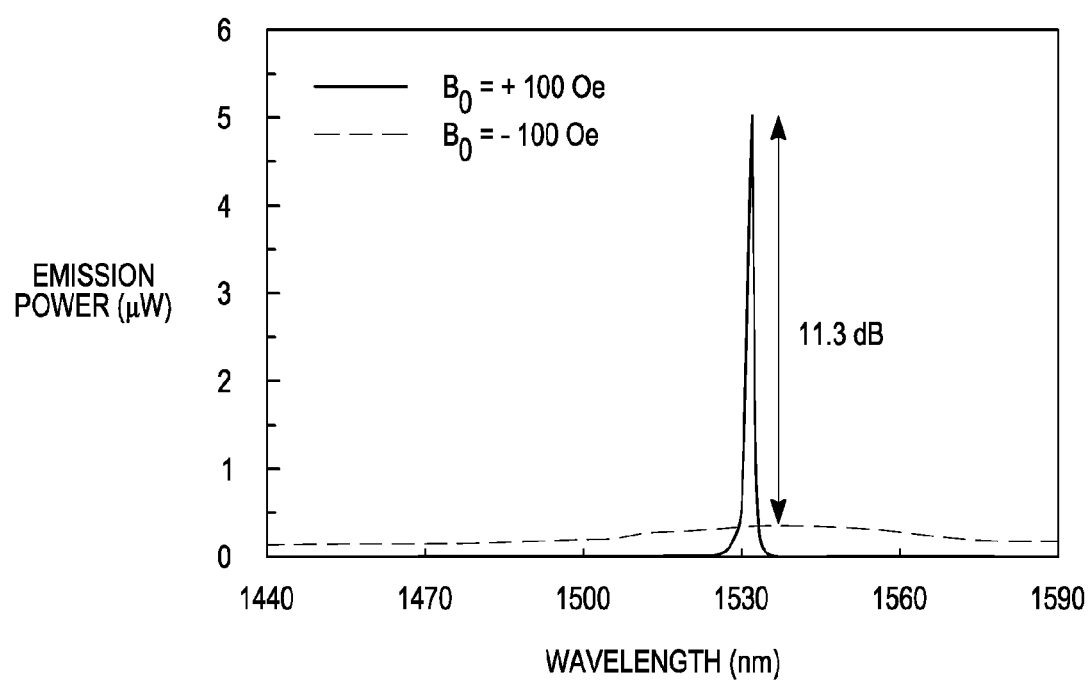
FIG. 4C shows the photoluminescence spectrum of the topological cavity device for two opposite values of the EMF for a pump power density of $\rho$=0.9 $\mu$W/$\mu$m$^2$.

Topological edge modes are robust against backscattering from imperfections and sharp corners. Beyond robust and passive transport, this implies the possibility to implement deformed cavities of arbitrary geometries. FIG. 4A shows a top view SEM of an arbitrarily-shaped topological cavity with a geometry approximating a flipped USA-like map with the same optical length as the square cavity. The device was optically pumped from the top, and the emission collected and analyzed from the tapered waveguide, once again using the lensed fiber. When the EMF is turned on, real space imaging of the top of the device, shown in FIG. 4B, provides evidence for an edge mode that is tightly confined at the boundary of the topologically distinct photonic structures. As shown in the real space imaging of the top of the device shown in FIG. 4D, when the EMF is turned off, the edge mode disappears. Unidirectional lasing with an isolation ratio of 11.3 dB was experimentally achieved with a pump power density of $\rho$=0.9 $\mu W/\mu m^2$ (see FIG. 4C, which shows the photoluminescence spectrum of the topological cavity for two opposite values of the EMF for a pump power density of $\rho$=0.9 $\mu W/\mu m^2$). As FIG. 4C demonstrates, for a forward bias ($B_0$), the cavity lases with stimulated emission, but for a backward bias ($-B_0$), a strong suppression of emission is obtained with an isolation ratio between ports of 11.3 dB. The edge mode disappears in FIG. 4D when the EMF is turned off because the non-trivial band gap closes.

In summary, non-reciprocal lasing from topological cavities of arbitrary geometries has been demonstrated. The topological cavities are closed contours between photonic structures with distinct topological invariants and thus support unidirectional edge states circulating around the cavity. The topologically distinct structures are made from two photonic crystals with overlapping trivial and non-trivial band gaps at telecommunication wavelengths. By evanescently coupling a waveguide to the topological cavity, stimulated emission from the one-way mode is coupled to a selected waveguide output with an isolation ratio as large as 11.3 dB. In one illustrative embodiment the cavities are implemented on structured InGaAsP, the semiconductor providing optical gain, bonded on a YIG substrate that breaks time-reversal symmetry in the devices. These results demonstrate the flexibility of topological cavities and open avenues in photonic integration where information can robustly flow between sectors characterized by their topological invariants and will enable the investigation of non-trivial photonic devices.

Although the subject matter has been described in language specific to structural features and/or methodological acts, it is to be understood that the subject matter defined in the appended claims is not necessarily limited to the specific features or acts described above.

The invention claimed is:

1. A laser source, comprising:
   a topological cavity for nonreciprocal lasing;
   a magnetic material arranged to interact with the topological cavity; and
   an optical waveguide arranged to receive light extracted from the topological cavity upon breaking of time-reversal symmetry in the topological cavity.

2. The laser source of claim 1 wherein the magnetic material is configured to break the time-reversal symmetry in the topological cavity upon application thereto of an external magnetic field.

3. The laser source of claim 1 wherein the topological cavity is configured to emit light upon being optically pumped.

4. The laser source of claim 1 wherein the topological cavity is configured to emit light upon being electrically pumped.

5. The laser source of claim 1 wherein the topological cavity includes a multiple quantum well (MQW) structure.

6. The laser source of claim 1 wherein the topological cavity includes first and second photonic crystals having topological invariants.

7. The laser source of claim 6 wherein the first and second photonic crystals have a common composition and different lattices.

8. The laser source of claim 6 wherein a boundary between the first and second photonic crystals defines a closed contour.

9. The laser source of claim 6 wherein the optical waveguide is a defect waveguide formed in one of the first and second photonic crystals that is located external to the closed contour.

10. The laser source of claim 5 wherein the multiple quantum well structure includes an InGaAsP quantum well material.

11. The laser source of claim 1 wherein the magnetic material is a garnet-based magnetic material.

12. The laser source of claim 11 wherein the garnet-based magnetic material includes Yttrium Iron Garnet (YIG).

13. A method for generating nonreciprocal laser light, comprising:
   applying pump energy to a topological cavity; and
   while applying the pump energy, applying a static magnetic field to a magnetic material so that time-reversal symmetry is broken in the topological cavity; and
   receiving, in an optical waveguide, light extracted from the topological cavity upon breaking of time-reversal symmetry in the topological cavity.

* * * * *